United States Patent [19]
Kondoh et al.

[11] Patent Number: 5,594,392
[45] Date of Patent: Jan. 14, 1997

[54] RING OSCILLATOR HAVING LARGE LOAD DRIVING CAPABILITY FOR USE AS VCO IN PHASE LOCKED LOOPS

[75] Inventors: Harufusa Kondoh; Hiromi Notani, both of Hyogo, Japan

[73] Assignee: Mitsubishi Denki Kabushi Kaisha, Tokyo, Japan

[21] Appl. No.: 460,939

[22] Filed: Jun. 5, 1995

[30]  Foreign Application Priority Data

Jun. 7, 1994 [JP] Japan ..................... 6-124999

[51] Int. Cl.⁶ .................. H03B 5/00; H03K 3/03; H03L 7/099
[52] U.S. Cl. .................. 331/57; 331/17; 331/34
[58] Field of Search .................. 331/17, 34, 57

[56]  References Cited

U.S. PATENT DOCUMENTS 5,416,444   5/1995  Yamauchi et al. ................... 331/57
5,442,325   8/1995  Bosshart ................... 331/57
5,448,205   9/1995  Rothermel ................... 331/57
5,465,076  11/1995  Yamauchi et al. ................... 331/57

OTHER PUBLICATIONS

Design of PLL–Based Clock Circuits, pp. 255–261, Deog--Kyoon JEONG et al, IEEE Journal of Solid–State Circuits, vol. sc–22, No. 2, Apr. 1977.

*Primary Examiner*—Siegfried H. Grimm
*Attorney, Agent, or Firm*—Lowe, Price, LeBlanc & Becker

[57]  ABSTRACT

A VCO circuit 4 of a PLL circuit 1 includes M delay time variable inverters 5.1 to 5.M which are connected in a ring shape. Load driving capability of delay time variable inverters 5.1 to 5.M is increased gradually toward output node OUT which is connected directly to load capacity CL. Accordingly, a high load driving capability is obtained without provision of a separate buffer.

12 Claims, 18 Drawing Sheets

FIG. 15
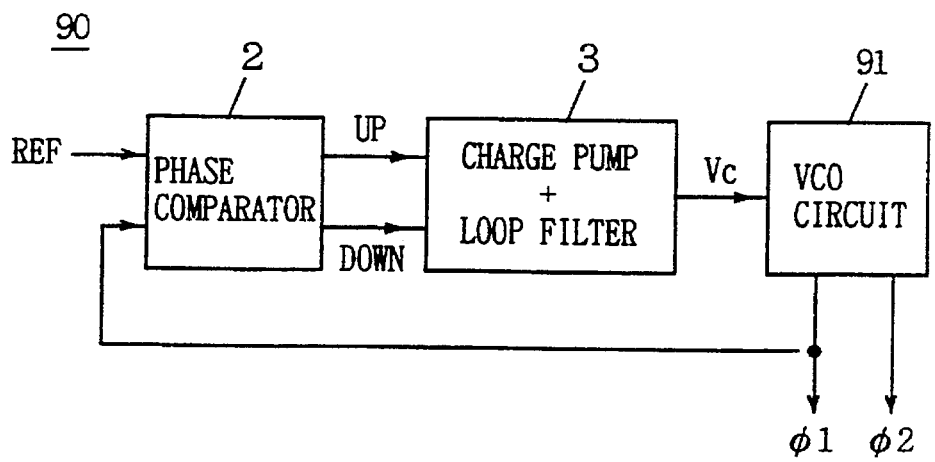
FIG. 16
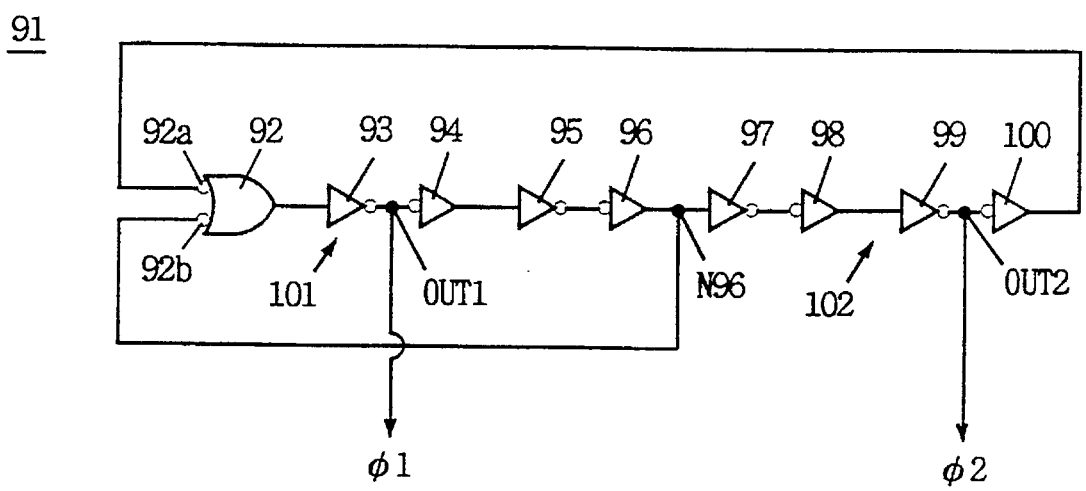
FIG. 17 { (a) φ1
(b) φ2
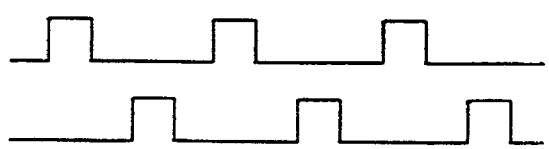

RING OSCILLATOR HAVING LARGE LOAD DRIVING CAPABILITY FOR USE AS VCO IN PHASE LOCKED LOOPS

BACKGROUND OF THE INVENTION

1. Field of the Invention

The present invention relates to an oscillator, a voltage controlled oscillator using the oscillator, and a phase locked loop circuit using the voltage controlled oscillator. More particularly, the present invention relates to an oscillator including a plurality of delay elements which are connected in a ring shape, a voltage controlled oscillator including that oscillator which oscillates at a frequency corresponding to a control voltage, and a phase locked loop circuit including that voltage controlled oscillator which produces an internal clock signal in synchronization with an externally applied reference clock signal.

2. Description of the Background Art

FIG. 22 is a block diagram showing a structure of a conventional phase locked loop (hereinafter represented by the abbreviation PLL) circuit 200 such as the one described in an article by Deog-Kyoon Jeong et al. entitled "Design of PLL-Based Clock Generation Circuits," FIG. 2, in *IEEE Journal of Solid-State Circuits*, VOL. sc- 22, No. 2 (April, 1987), pp. 255–261.

Referring to FIG. 22, this PLL circuit 200 includes a phase comparator 210, a charge pump+loop filter 220, a VCO circuit 230, a decoder+buffer 240, and a plurality of inverters 201 to 205.

Phase comparator 210 receives a reference clock signal REF which is amplified by inverters 201, 202 as well as an internal clock signal φ1 which is amplified by inverters 205, 203, and 204, and outputs control signals UP and DOWN corresponding to the phase difference between the received two clock signals REF and φ1. If the phase of internal clock signal φ1 lags behind reference clock signal REF, control signal UP is at "L" level and control signal DOWN is at "H" level. On the contrary, if the phase of internal clock signal φ1 precedes reference clock signal REF, control signal UP is at "H" level and control signal DOWN is at "L" level.

As shown in FIG. 23, charge pump+loop filter 220 includes a charge pump 220a and a loop filter 220b. Charge pump 220a includes inverters 221 to 223, a P channel MOS transistor 224 and an N channel MOS transistor 225. Loop filter 220b includes resistances 226, 227 and a capacitor 228. P channel MOS transistor 224 and N channel MOS transistor 225 are connected in series between a power supply terminal Vcc and a ground terminal GND. Control signal UP is input to the gate of P channel MOS transistor 224 via inverters 221 and 222 while control signal DOWN is input to the gate of N channel MOS transistor 225 via inverter 223. Resistances 226, 227 and capacitor 228 are connected in series between a ground terminal GND and a connection node N201 located between P channel MOS transistor 224 and N channel MOS transistor 225. A control voltage Vc is output from a connection node N202 between resistances 226 and 227.

When control signal UP is at "L" level and control signal DOWN is at "H" level, P channel MOS transistor 224 is turned on and N channel MOS transistor 225 is turned off. Charge current flows into capacitor 228 from power supply terminal Vcc through P channel MOS transistor 224 and resistances 226 and 227, and control voltage Vc is increased.

On the contrary, when control signal UP is in "H" level and control signal DOWN is in "L" level, N channel MOS transistor 225 is turned on and P channel MOS transistor 224 is turned off. Discharge current flows to ground terminal GND from capacitor 228 through resistances 227, 226 and N channel MOS transistor 225, so as to reduce control voltage Vc.

In other words, control voltage Vc is increased when the phase of internal clock signal φ1 lags behind reference clock signal REF, and is reduced when the phase of internal clock signal φ1 precedes reference clock signal REF.

In the above article, loop filter 220b is formed with separate components and independent from other circuits and is provided externally to the semiconductor chip.

Voltage controlled oscillator (hereinafter referred to as VCO circuit) 230 includes eight delay time variable inverters 231 to 238 and an ordinary inverter 239 connected in a ring shape, as shown in FIG. 24. Ordinary inverter 239 is provided so that delay time variable inverters 231 to 238 and inverter 239 will be odd-numbered in total.

Delay time (inverting time) of delay time variable inverters 231 to 238 varies depending on control voltage Vc of charge pump+loop filter 220. Inverting time of ordinary inverter 239 is set so that it is sufficiently shorter than the delay time of delay time variable inverters 231 to 238.

Accordingly, VCO circuit 230 will oscillate at a frequency corresponding to control voltage Vc, and clock signals C231 to C238 with a duty ratio of 50% as shown in FIG. 25(a) to (h) are output from output nodes of delay time variable inverters 231 to 238, respectively. Assuming that a single cycle of clock signals C231 to C238 is 360°, clock signals C232, C234, C236, and C238 are inverted delayed by 360°/16=22.5° from clock signals C231, C233, C235, and C237, respectively.

Decoder+buffer 240 receives eight clock signals C231 to C238 from VCO circuit 230, amplifies them after a prescribed logic operation and outputs four non-overlapped signals $_c1$ to $_c4$. The logical product of signals C231 and C234 would be signal φ1 and the logical product of signals C235 and C238 would be signal φ2. The logical product of inverted signals $\overline{C231}$ and $\overline{C234}$ of signals C231 and C234 would be signal φ3 and the logical product of inverted signals $\overline{C235}$ and $\overline{C238}$ of signals C235 and C238 would be signal φ4. These signals φ1 to φ4 are employed as internal clock signals in the chip. Signal φ1 is amplified by inverter 205 and is output as an external clock signal OSC, and in addition, it is amplified by inverters 203 and 204 to be input to phase comparator 210.

If loop filter 220b, which is provided externally in the article described above, could be provided as an integrated circuit on the semiconductor chip, the external components for forming the loop filter 220b would be unnecessary so that the PLL circuit can be made more compact, made less expensive, and increased in its reliability.

However, as can be seen from chapter 3 of the above article, the condition for the stability of PLL circuit 200 is to satisfy the following equation (1):

$$k\tau_2 < \cfrac{1}{\cfrac{\pi}{\omega_i \tau_2}\left[\cfrac{\pi}{\omega_i \tau_2} + \left(1 - \cfrac{td}{\tau_2}\right)\right]} \quad (1)$$

where $k = k_0 R_2 I_p$, $k_0$ is the gain (MHz/V) of VCO circuit 230, $R_2$ is the resistance value (Ω) of resistance 227, $I_p$ is the current (A) of charge pump 220a, $\omega_i = 2\pi f_i$, $f_i$ is the frequency (Hz) of reference clock signal REF, $\tau_2 = R_2C$, and td is the delay time (s) of decoder+buffer 240.

When this equation is analyzed, it is found that conditions for the stability of PLL circuit 200 may not be satisfied if loop filter 220b is provided on the semiconductor chip.

In the article, resistance value $R_1$ of resistance 226 is 50 kΩ, resistance value $R_1$ of resistance 227 is 100 Ω, capacitance C of capacitor 228 is 0.1 μF (meaning that it is impossible to form this capacitor on the semiconductor chip), frequency $f_i$ of reference clock signal REF is 1 to 18 MHz (the rating value of which being 6.7 MHz), gain $k_0$ of VCO circuit 230 is 12 MHz/V, and current $I_p$ of charge pump 220a is approximately (5–1.5)/50 k=70 μA (assuming that supply voltage is 5 V). Accordingly, $\tau_2 = R_2C = 100 \times 0.1 \times 10^{-6} = 10$ μsec, and therefore, td/$\tau_2$ in the above equation (1) can be substantially 0. In other words, since delay time td in the current integrated circuit is in the order of several tens of nano seconds at most, td/$\tau_2$ would be approximately $10^{-3}$. Since td only appears in the term (1−td/$\tau_2$) of the denominator of the above equation (1), td/$\tau_2$ may be neglected.

When attempting to incorporate capacitor 228 of loop filter 220b into the integrated circuit, however, capacitance of the capacitor 228 which can be implemented at a reasonable cost would be about 100 pF at most. Accordingly, it is apparent that if td is 10 nsec, for example, then td/$\tau_2=10\times 10^{-9}/100\times 1000\times 10^{-12}=1$, meaning that td/$\tau_2$ cannot be ignored.

When considering the equation only, it seems possible to increase resistance value $R_2$ of resistance 227, but it is not preferable because it would cause an increase in the difference between control voltage Vc when charge pump 220b is on and off, and ripple will occur as a jitter which degrades the performance of PLL circuit 200. Therefore, it is clear that delay time td must be suppressed. Preferred value of td/$\tau_2$ is about 0.1 or lower.

It is believed that buffer 242 of decoder+buffer 240 has the largest contribution to the occurrence of delay time td. As shown in FIG. 26, buffer 242 includes N inverters 242.1 to 242.N (N being a prime number) connected in series. As shown in FIG. 27, inverters 242.1 to 242.N each include a P channel MOS transistor 243 and an N channel MOS transistor 244 which are connected in series with one another between power supply terminal Vcc and ground terminal GND.

The number N of inverters 242.1 to 242.N constituting buffer 242 depends on magnitude of load capacitance. For example, when the load capacitance is 50 pF, the MOS transistor in inverter 242.N of the final stage requires a channel width W of about 100 μm. In addition, it is believed that incrementing each channel width W so that it is 3 to 4 times larger than that of the previous stage, is most effective. Accordingly, if channel width W of an MOS transistor used for an ordinary internal gate is about 3 μm, six inverters are required. Inverters 242.1 to 242.N in buffer 242 have delay time of around 1 nsec, respectively, in order to drive the inverter of the next stage which is larger than themselves. If a delay time of about 2 to 3 nsec has occurred at decoder 241, there would soon be a td of about 10 nsec. Therefore, stability of PLL circuit 200 would be less reliable.

In addition, stability of PLL circuit 200 is often presented by phase margin (PM) shown in the following equation (2).

$$PM = \tan^{-1}\left[\frac{k\tau_2}{\sqrt{2}}\left\{1+\left[1+\left(\frac{2}{k\tau_2}\right)^2\right]^{0.5}\right\}^{0.5}\right] - \quad (2)$$

$$\frac{360°}{2\pi} \cdot \frac{k\tau_2}{\sqrt{2}}\left\{1+\left[1+\left(\frac{2}{k\tau_2}\right)^2\right]^{0.5}\right\}^{0.5} \cdot \frac{td}{\tau_2}$$

In the above article, the values of $k\tau_2$ and td/$\tau_2$ are as follows.

$$k\tau_2 = k_0 R_2 I_p C R_2$$
$$= 12 \times 10^6 \times 100 \times 70 \times 10^{-6} \times 0.1 \times 10^{-6} \times 100$$
$$= 8.4 \times 10^{-2}$$

$$td/\tau_2 = 10 \times 10^{-9}/100 \times 0.1 \times 10^{-6}$$
$$= 1 \times 10^{-3}$$

When these values $k\tau_2$ and td/$\tau_2$ are inserted to the above equation (2), $$PM = \tan^{-1}\left[\frac{0.084}{\sqrt{2}}\left\{1+\sqrt{1+\left(\frac{2}{0.084}\right)^2}\right\}^{0.5}\right] - \quad (3)$$

$$\frac{360°}{2\pi} \cdot \frac{0.084}{\sqrt{2}}\left\{1+\sqrt{1+\left(\frac{2}{0.084}\right)^2}\right\}^{0.5} \times 10^{-3}$$

$$= \tan^{-1}(5.9 \times 10^{-2} \times 4.98) - 3.38 \times 4.98 \times 10^{-3}$$
$$\approx 16.6°$$

and it can be understood that PLL circuit 200 will operate with stability.

However, if td/$\tau_2$ is 1 when capacitor 228 is incorporated into the chip and buffer 242 having a high load driving capability is provided as in the above description, then PM<φ, and the operation of PLL circuit 200 would be unstable.

In addition, in the conventional PLL circuit 200, decoder 241 is indispensable in order to obtain a plurality of non-overlapped signals with a duty ratio of about 25%, which also has been preventing reduction in size and cost of the circuit.

SUMMARY OF THE INVENTION

Based upon the foregoing, it is a first object of the present invention to provide an oscillator which can produce a plurality of non-overlapped signals with duty ratio of about 25%.

It is a second object of the present invention to provide a voltage controlled oscillator with a high load driving capability which does not require a separate buffer.

It is a third object of the present invention to provide a phase locked loop circuit with a high load driving capability which operates stably within a wide range of frequency.

It is a fourth object of the invention to further provide a phase locked loop circuit which is compact, low in cost, and highly reliable.

In the oscillator according to the present invention, briefly speaking, an output of intermediate element among a plurality of delay elements connected in series is input to an element at a starting end in synchronization with an output of an element at a terminating end. Accordingly, the plurality of elements from the one at the starting end to the intermediate ones are connected in a ring shape, and would oscillate in synchronization with the output of the element at the terminating end, or the connection between the plurality of elements would be broken so as to stop the oscillation. Thus, if the intermediate elements and the element for leading out the output are selected appropriately, a plurality of non-overlapped signals with duty ratio of about 25% can be obtained.

In the first voltage controlled oscillator according to the present invention, briefly speaking, the load driving capability of the delay time variable elements is increased gradually toward the output so that a large load driving capability is obtained without provision of a separate buffer.

In the second voltage controlled oscillator according to the present invention, briefly speaking, the delay elements of the oscillator described above are replaced by delay time variable elements and the load driving capability of delay time variable elements is increased gradually toward the output. Therefore, a plurality of non-overlapped signals with duty ratio of about 25% is obtained, and a large load driving capability is obtained without provision of a separate buffer.

In the first phase locked loop circuit according to the present invention, briefly speaking, the first voltage controlled oscillator described above is provided. Accordingly, a large load driving capability is obtained without provision of a separate buffer, so that there is no delay time caused by a buffer which leads to an unstable operation of the circuit.

In the second phase locked loop circuit according to the present invention, briefly speaking, the second voltage controlled oscillator described above is provided. Accordingly, a plurality of non-overlapped signals with duty ratio of about 25% are obtained without provision of a separate decoder, and a large load driving capability is obtained without provision of a separate buffer. Since decoder and buffer are not required, there is no delay time caused by a decoder or a buffer which leads to an unstable operation of the circuit.

In the first and second phase locked loop circuits, a control voltage generating circuit is preferably formed of a phase comparator, a capacitor, and a charge pump. Thus, control voltage is produced easily.

More preferably, the capacitor is provided on a semiconductor substrate along with delay time variable elements. Thus, the circuit would be more compact, made less expensive, and increased in its reliability.

More preferably, a divider circuit for dividing the frequency of an internal clock signal which is output to the control voltage generating circuit is provided. Thus, an internal clock signal is produced which has a frequency higher than that of a reference clock signal by a multiple of an inverse number of the dividing ratio.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a block diagram showing a structure of a PLL circuit in accordance with a fourth embodiment of the present invention.

FIG. 16 is a circuit block diagram showing a structure of a VCO circuit in the PLL circuit of FIG. 15.

FIG. 17 shows waveforms of output signals φ1 and φ2 of VCO circuit in FIG. 16.

DESCRIPTION OF THE PREFERRED EMBODIMENTS

Embodiment 1

Figure 1:
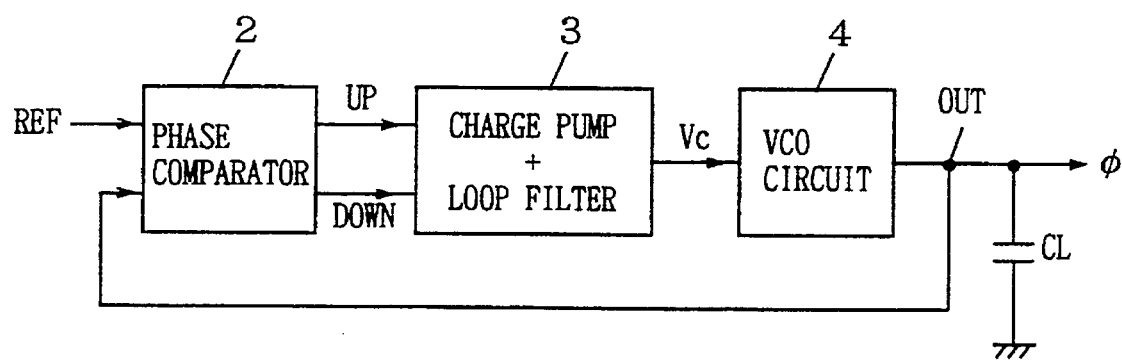
FIG. 1 is a block diagram showing a structure of a PLL circuit according to a first embodiment of the present invention.

FIG. 1 is a block diagram showing a structure of a PLL circuit 1 according to a first embodiment of the present invention. Referring to FIG. 1, this PLL circuit 1 includes a phase comparator 2, a charge pump+loop filter 3 and a VCO circuit 4.

Phase comparator 2 receives, like phase comparator 210 of the conventional example, a reference clock signal REF and an internal clock signal φ which is an output of this PLL circuit 1, and outputs control signals UP and DOWN corresponding to the phase difference between the received two clock signals REF and φ.

Charge pump+loop filter 3 is, like conventional charge pump+loop filter 220, driven by the clock signals UP and DOWN from phase comparator 2 so as to output a control voltage Vc. If the phase of internal clock signal φ lags behind reference clock signal REF, control voltage Vc is made higher. If the phase of internal clock signal φ precedes reference clock signal REF, control voltage Vc lowers.

VCO circuit 4 oscillates at a frequency f corresponding to control voltage Vc and outputs signal φ. While output signal φ is supplied directly to a load capacitance CL, it is also fed back to phase comparator 2.

Figure 2:
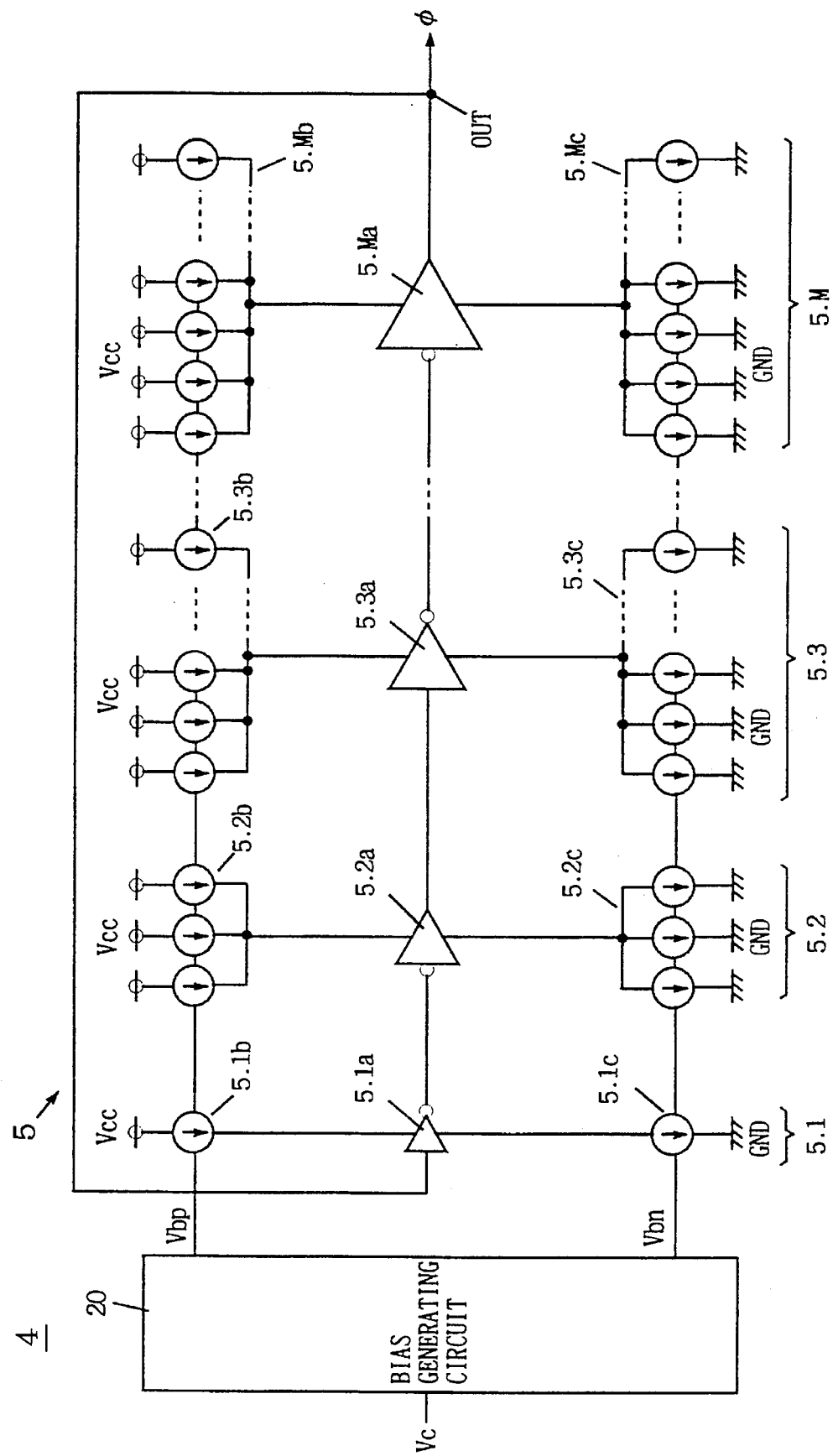
FIG. 2 is a circuit block diagram showing a structure of a VCO circuit in the PLL circuit shown in FIG. 1.

FIG. 2 is a circuit block diagram showing a structure of VCO circuit 4. Referring to FIG. 2, this VCO circuit 4 includes a bias generating circuit 20 and a ring oscillator 5. Bias generating circuit 20 outputs bias voltages Vbp and Vbn corresponding to control voltage Vc, while ring oscillator 5 oscillates at frequency f corresponding to bias voltages Vbp and Vbn.

Ring oscillator 5 includes delay time variable inverters 5.1 to 5.M of M stages (M being a prime number), which are connected in a ring shape. Load driving capability of delay time variable inverters 5.1 to 5.M is increased gradually toward an output node OUT.

Delay time variable inverters 5.1 to 5.M include inverter portions 5.1a to 5.Ma, positive side current sources 5.1b to 5.Mb, and negative side current sources 5.1c to 5.Mc, respectively.

As for inverter portions 5.1a to 5.Ma, magnitude of the load driving capability for each portion is indicated by the size of its symbol. Magnitude of current supplying capability of positive side current sources 5.1b to 5.Mb and negative side current sources 5.1c to 5.Mc is indicated by the number of symbols for respective current sources. When load driving capabilities of inverter portions 5.2a to 5.Ma are three times as large as those of preceding inverter portions 5.1a to 5.(M−1)a for example, current supplying capabilities for current sources 5.2b to 5.Mb and 5.2c to 5.Mc are also made three times as large as those of preceding stages so that delay times for each of delay time variable inverters 5.1 to 5.M would be equal to each other.

Figure 3:
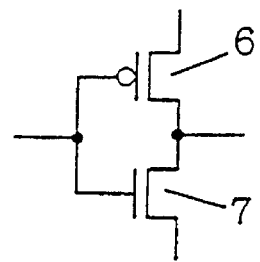
FIG. 3 is a circuit diagram showing a structure of an inverter portion of a delay time variable inverter in the VCO circuit shown in FIG. 2.

As shown in FIG. 3, inverter portions 5.1a to 5.Ma each include a P channel MOS transistor 6 and an N channel MOS transistor 7 connected in series. Channel width W of P channel MOS transistors 6 and N channel MOS transistors 7 in inverter portions 5.1a to 5.Ma, respectively, is set such that each width is increased gradually. Accordingly, load driving capability of inverter portions 5.1b to 5.Mb is also increased gradually.

Gates of transistors 6 and 7 which are commonly connected with each other serve as an input node of each of inverter portions 5.1a to 5.Ma, while sources of transistors 6 and 7 serve as an output node of each of inverter portions 5.1a to 5.Ma. Drain of P channel MOS transistor 6 is connected to corresponding one of positive side current sources 5.1b to 5.Mb, and a drain of N channel MOS transistor 7 is connected to corresponding one of negative side current source 5.1c to 5.Mc.

Although it is preferred that load driving capability of each of delay time variable inverters 5.2 to 5.M is set so that it is three times as large as load driving capability of the preceding delay time variable inverters 5.1 to 5.M-1, the rate of multiplication does not have to be 3, and it does not have to be constant.

Figure 4:
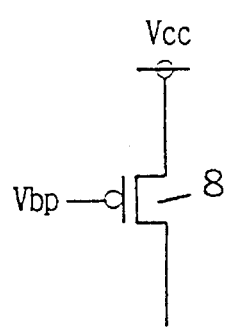
FIGS. 4(a) and 4(b) are circuit diagrams showing a structure of a positive side current source of the delay time variable inverter in the VCO circuit shown in FIG. 2.
Figure 4:
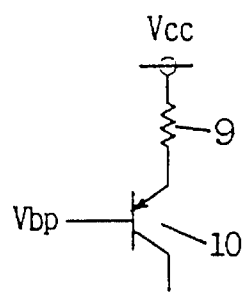

As shown in FIGS. 4(a) and 4(b), positive current sources 5.1b to 5.Mb each includes a P channel MOS transistor 8 having its drain connected to power supply node Vcc and its gate supplied with bias voltage Vbp, or a PNP transistor 10 having its emitter connected to power supply node Vcc via resistance 9 and its base supplied with bias voltage Vbp.

Figure 5:
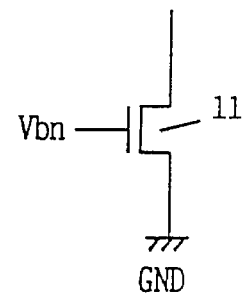
FIGS. 5(a) and 5(b) are circuit diagrams showing a structure of a negative side current source of the delay time variable inverter in the VCO circuit shown in FIG. 2.
Figure 5:
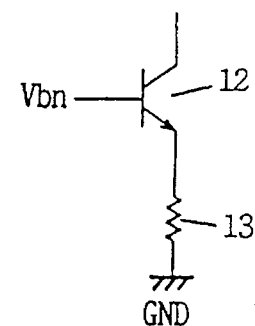

As shown in FIGS. 5(a) and 5(b), each of negative current sources 5.1c to 5.Mc includes an N channel MOS transistor 11 having its drain connected to ground node GND and its base supplied with bias voltage Vbn, and an NPN transistor 12 having its drain connected to ground node GND via resistance 13 and its base supplied with bias voltage Vbn.

Figure 6:
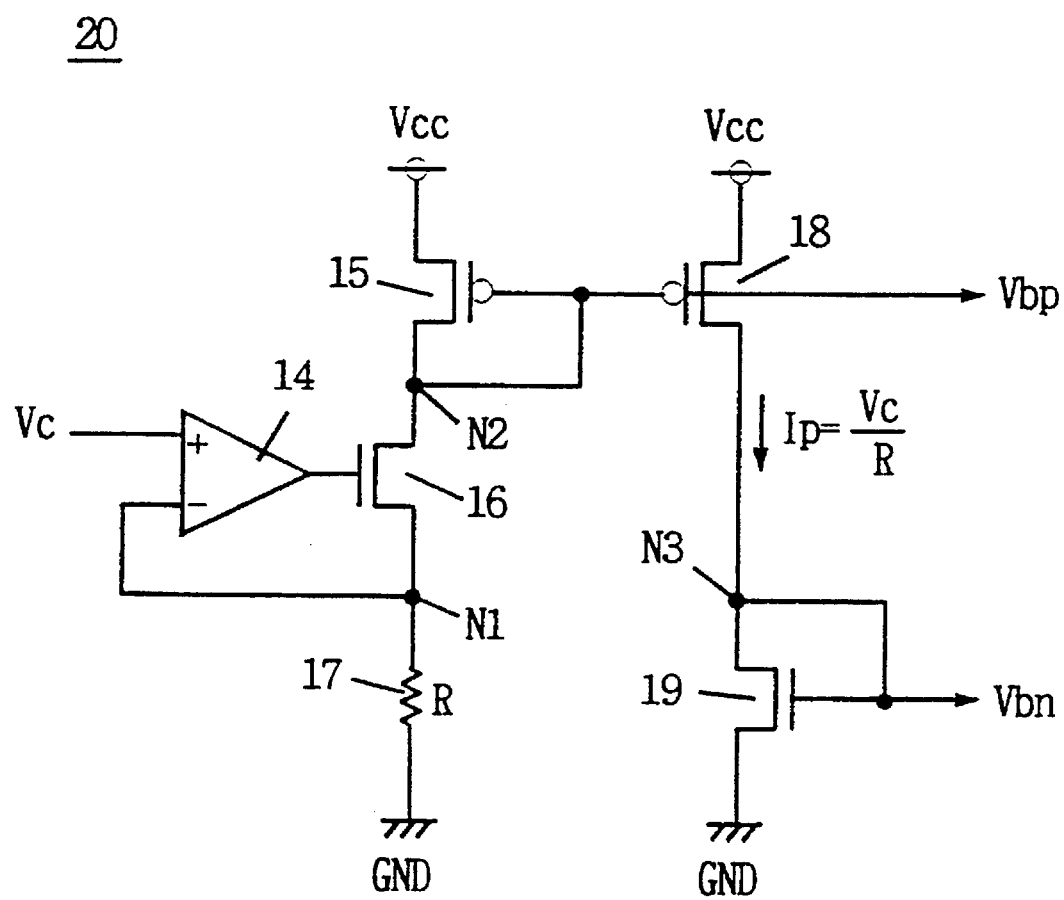
FIG. 6 is a circuit diagram illustrating a structure of a bias generating circuit in the VCO circuit shown in FIG. 2.

FIG. 6 is a circuit diagram illustrating a structure of bias generating circuit 20. Referring to FIG. 6, this bias generating circuit 20 includes an operational amplifier 14, p channel MOS transistors 15, 18, N channel MOS transistors 16, 19, and a resistance 17.

P channel MOS transistor 15, a node N2, N channel MOS transistor 16, a node N1 and resistance 17, as well as P channel MOS transistor 18, a node N3 and N channel MOS transistor 19 are connected in series between power supply node Vcc and ground node GND, respectively. Operational amplifier 14 has its output node connected to a gate of N channel MOS transistor 16, its inverted input node connected to node N1, and its non-inverted input node supplied with control voltage Vc. P channel MOS transistors 15 and 18 have their gates commonly connected with each other and also to node N2. P channel MOS transistors 15 and 18 form a current mirror circuit. N channel MOS transistor 19 has its gate connected to node N3.

Since the voltage at node N1 is fed back negatively to operational amplifier 14, it is controlled by operational amplifier 14 so that it would be equal to control voltage Vc. Accordingly, the value of current Ip which flows through a path formed by transistors 15, 16 and resistance 17 is obtained from the equation Ip=Vc/R (where R is the resistance value of resistance 17).

In addition, since P channel MOS transistors 15 and 18 constitute a current mirror circuit, assuming that they are equal in size, the current which flows into P channel MOS transistor 18 and N channel MOS transistor 19 is also Ip.

Thus, if each of positive current sources 5.1b to 5.Mb shown in FIG. 2 is formed of a P channel MOS transistor having its gate connected to node N2 and if bias voltage Vbp is input to this gate, a current rpIp flows into that P channel MOS transistor, the value of which current obtained by multiplying current Ip by the size ratio rp of that P channel MOS transistor with respect to P channel MOS transistor 15.

Similarly, if each of negative current sources 5.1c to 5.Mc is formed of an N channel MOS transistor having its gate connected to node N3 and if bias current Vbn is input to that gate, a current rnIp flows into that N channel MOS transistor, the value of which current obtained by multiplying Ip by the size ratio rn of that N channel MOS transistor with respect to N channel MOS transistor 19.

In this embodiment, since load driving capabilities of delay time variable inverters 5.1 to 5.M in VCO circuit 4 are set to be increased gradually toward output node OUT, and since delay time variable inverter 5.M at the final stage drives load capacitance CL directly, provision of a separate buffer 242 for load driving as in the conventional example is not necessary. Accordingly, excessive delay time td caused by buffer 242, and thus any unstable operation of PLL circuit 1 caused by delay time td, are eliminated.

In addition, since the range of stable operation of PLL circuit 1 is widened corresponding to the elimination of excessive delay time td caused by buffer 242, capacitance of capacitor 23 in loop filter 3b can be reduced correspondingly. Therefore, it is possible to form loop filter 3b on the semiconductor chip.

Figure 7A:
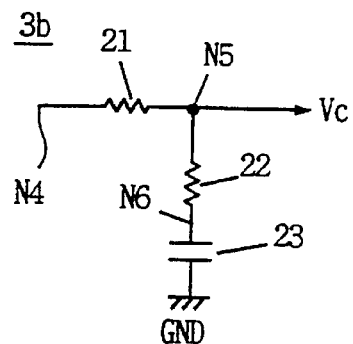
FIG. 7A is a circuit diagram showing a structure of a loop filter in the PLL circuit shown in FIG. 1.
Figure 23:
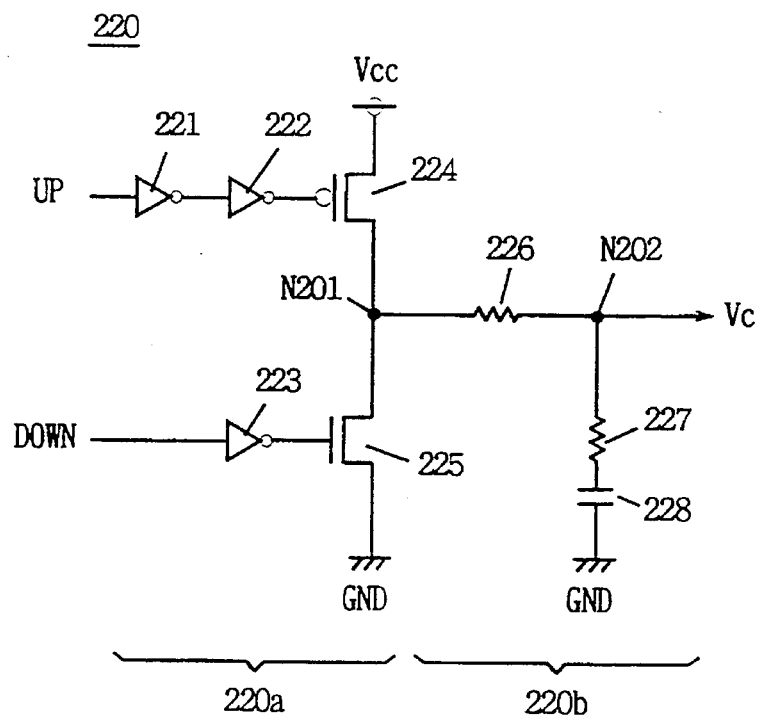
FIG. 23 is a circuit diagram showing a structure of a charge pump+loop filter in the PLL circuit of FIG. 22.
Figure 24:
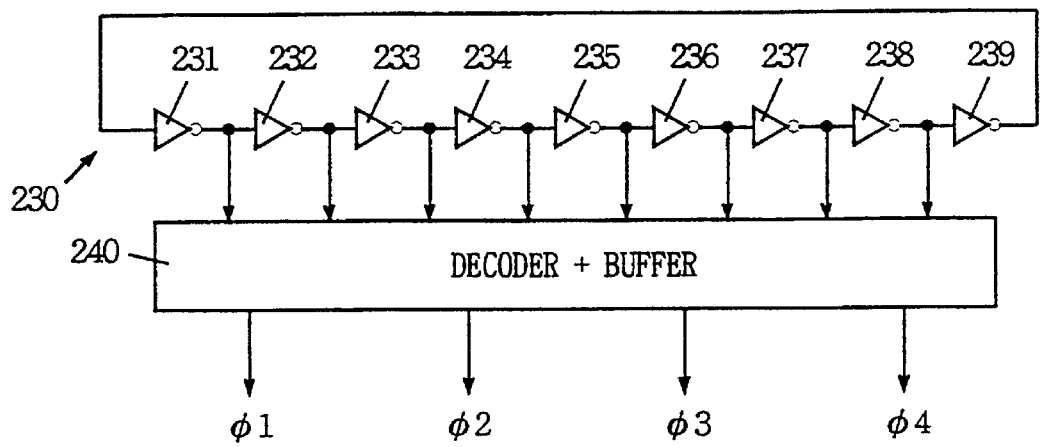
FIG. 24 is a circuit block diagram showing a structure of a VCO circuit and a decoder+buffer in the PLL circuit of FIG. 22.
Figure 25:
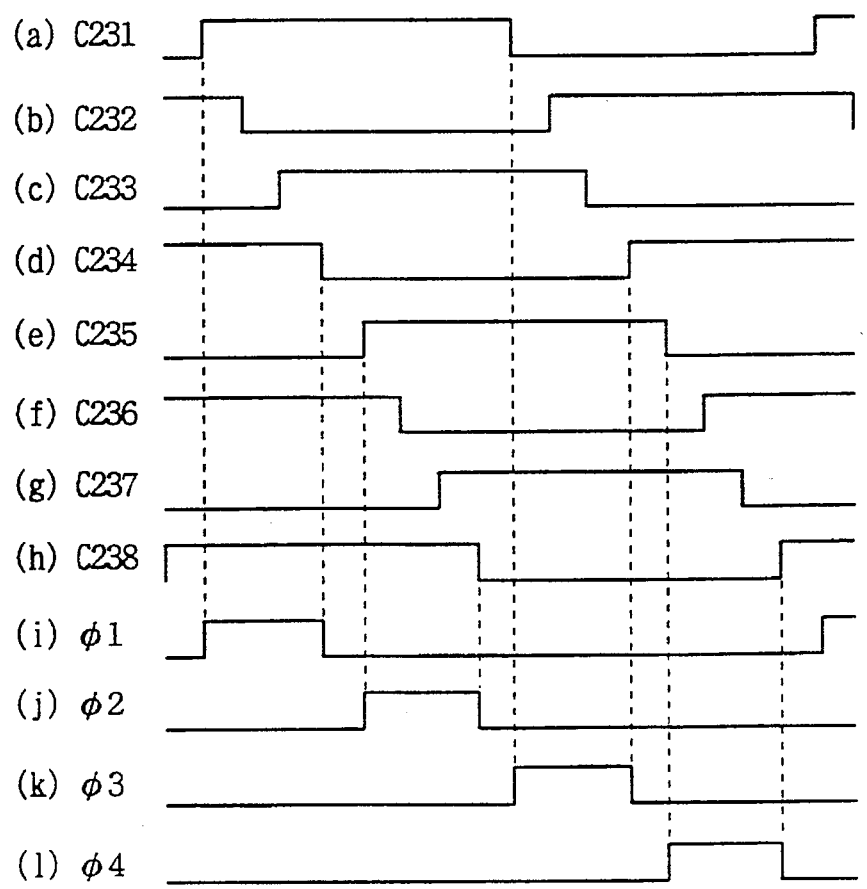
FIG. 25 is a timing chart for the operation of the VCO circuit and the decoder+buffer in FIG. 24.
Figure 26:
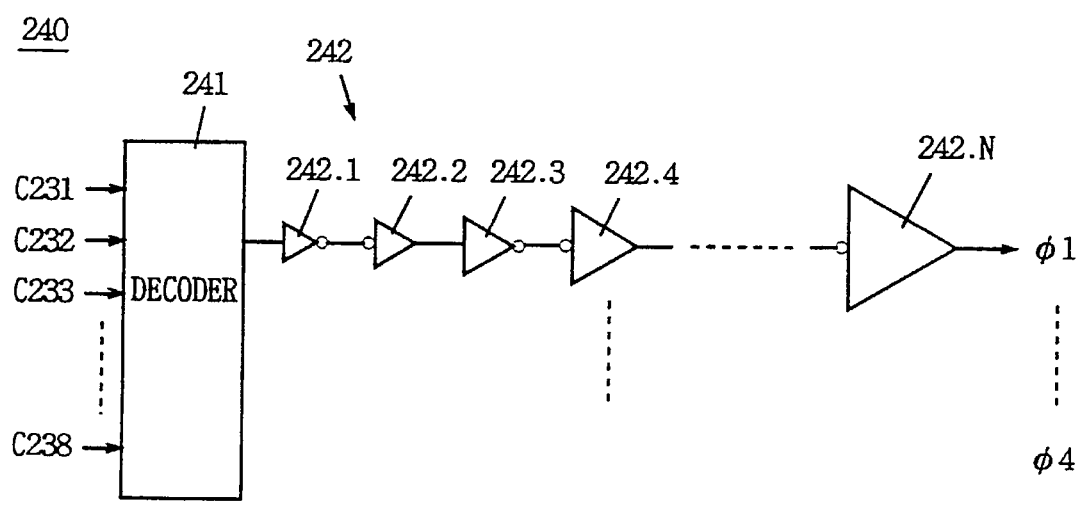
FIG. 26 is a partially omitted circuit block diagram showing a structure of a decoder+buffer in the PLL circuit of FIG. 22.
Figure 27:
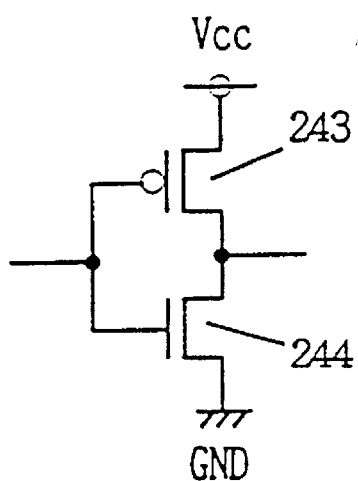
FIG. 27 is a circuit diagram showing a structure of an inverter of the decoder+buffer in FIG. 26.

As shown in FIG. 7A, loop filter 3b includes resistances 21, 22, and a capacitor 23. The structure of this circuit is identical to that of loop filter 220b in the conventional PLL circuit 200 shown in FIG. 23.

Figure 7B:
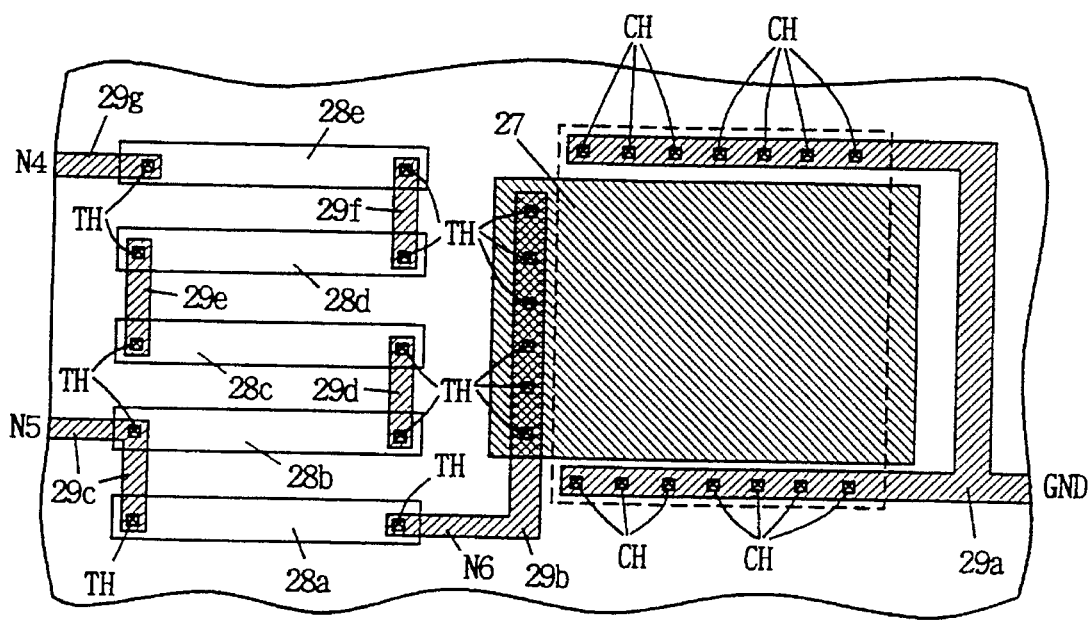
FIG. 7B is a partially cutaway plan view showing the layout of the structure of FIG. 7A.
Figure 7C:
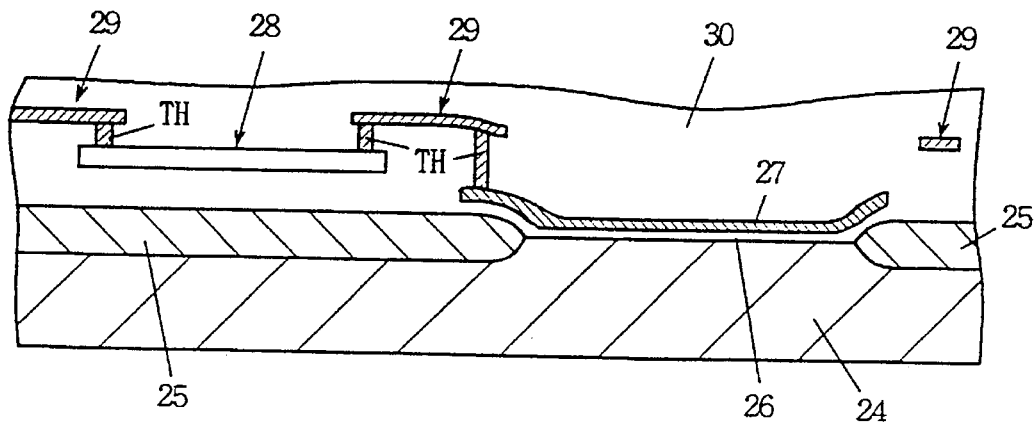
FIG. 7C is a cross section of the principal parts of FIG. 7B.

FIG. 7B is a partially cutaway plan view showing an example where gate capacitance of an MOS transistor is employed as the capacitance of capacitor 23, and FIG. 7C is a cross section showing the principal portions thereof.

Referring to FIGS. 7A to 7C, a P type silicon substrate 24 has its surface separated by a LOCOS film 25, and a gate electrode 27 is formed on a central portion of the surface of P type silicon substrate 24 exposed from LOCOS film 25, with a gate oxide film 26 therebetween. These P type silicon substrate 24 and gate electrode 27 which are opposite to each other form capacitor 23.

A polycrystalline silicon interconnection pattern 28 is formed above LOCOS film 25, and an aluminum interconnection pattern 29 is further formed thereabove. Then, the surface is entirely coated with a passivation film 30.

P type silicon substrate 24 exposed from LOCOS film 25 has its both ends connected to an aluminum interconnection 29a through a plurality of contact holes CH, and aluminum interconnection 29a is connected to the ground.

Surface of gate electrode 27 is connected to an aluminum interconnection 29b via a plurality of through holes TH, and aluminum interconnection 29b is connected to one end of polycrystalline silicon interconnection 28a via a through hole TH. This polycrystalline silicon interconnection 28a forms resistance 22 shown in FIG. 7A.

The other end of polycrystalline silicon interconnection 28a is connected to one end of polycrystalline silicon interconnection 28b by aluminum interconnection 29c as well as to bias generating circuit 20 via a node N5. Polycrystalline silicon interconnections 28b to 28e are connected in series by a plurality of through holes TH and aluminum interconnections 29d to 29f. The serially connected polycrystalline silicon interconnections 28b to 28e form resistance 21 shown in FIG. 7A. The other end of polycrystalline silicon interconnection 28e is connected to an output node of the charge pump via node N4 by through hole TH and aluminum interconnection 29g.

When loop filter 3b is formed on the semiconductor chip as described above, PLL circuit 1 may be made more compact, reduced in cost, and increased in its reliability, as compared to the conventional example where loop filter 220b was provided externally.

Embodiment 2

Figure 8:
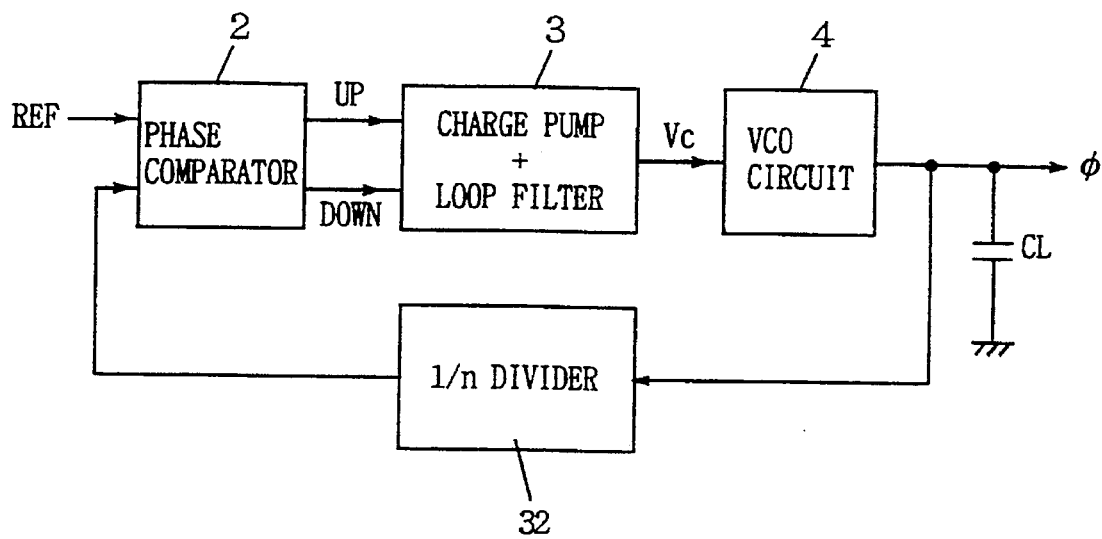
FIG. 8 is a block diagram showing a structure of a PLL circuit in accordance with a second embodiment of the present invention.

FIG. 8 is a block diagram showing a structure of a PLL circuit 31 according to a second embodiment of the present invention. Referring to FIG. 8, PLL circuit 31 includes a 1/n divider 32 in addition to a phase comparator 2, a charge pump+loop filter 3 and a VCO circuit 4. 1/n divider 32 performs 1/n division of the frequency of output $\phi$ from VCO circuit 4 which is then fed back to phase comparator 2. Thus, according to this PLL circuit 31, an internal clock signal $\phi$ is produced, the frequency of which being higher than that of reference clock signal REF such that its value is a multiple of the inverse number of dividing ratio 1/n (that is, a multiple of n).

Since the operating speed of divider 32 is limited, a delay time td is produced at divider 32, and range of stable operation for PLL circuit 31 is reduced as compared to PLL circuit 1 of the first embodiment. However, delay time td produced by divider 32 is shorter than the delay time td of about 10 nsec caused by the buffer in the conventional example. Accordingly, the range of stable operation of PLL circuit 31 is wider as compared to the conventional PLL circuit 200.

Embodiment 3

Figure 9:
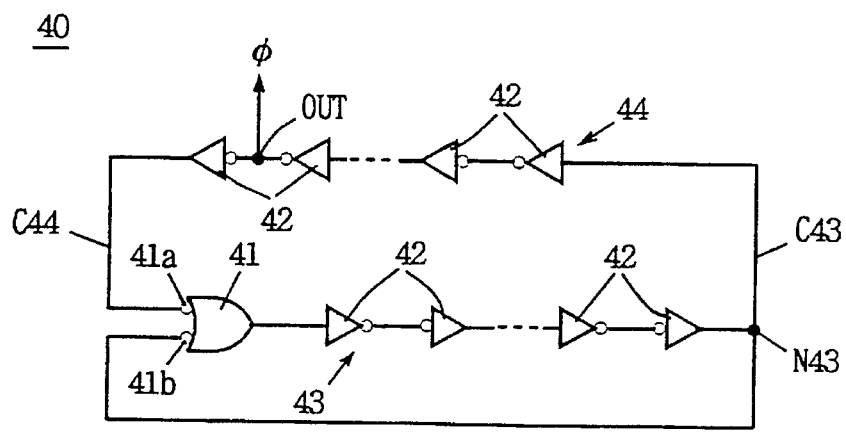
FIG. 9 is a partially omitted circuit block diagram showing a structure of a VCO circuit in accordance with a third embodiment of the present invention.

FIG. 9 is a block diagram showing a structure of a VCO circuit 40 according to a third embodiment of the present invention. For simplicity of description, circuits relating to current control (such as bias generating circuit 20, current sources 5.1b to 5.Mb, and 5.1c to 5.Mc shown in FIG. 2) are not shown in FIG. 9.

This VCO circuit 40 can produce a clock signal $\phi$ which does not have a duty of 50%. VCO circuit 40 includes an NAND gate 41, a first delay line 43 having a prescribed delay time td1, and a second delay line 44 having a prescribed delay time td2 (where td2≈td1). First and second delay lines 43 and 44 include even number of serially connected delay time variable inverters 42, respectively.

First delay line 43 is connected between an output node of NAND gate 41 and an intermediate node N43. Intermediate node N43 is connected to one input node 41b of NAND gate 41. Second delay line 44 is connected between intermediate node N43 and the other input node 41a of NAND gate 41. Output node OUT is connected to an output node of odd-numbered delay time variable inverter 42 in second delay line 44 (the inverter at the second from the last stage in the drawing). Load driving capability of delay time variable inverters 42 is increased gradually toward output node OUT.

Figure 10:
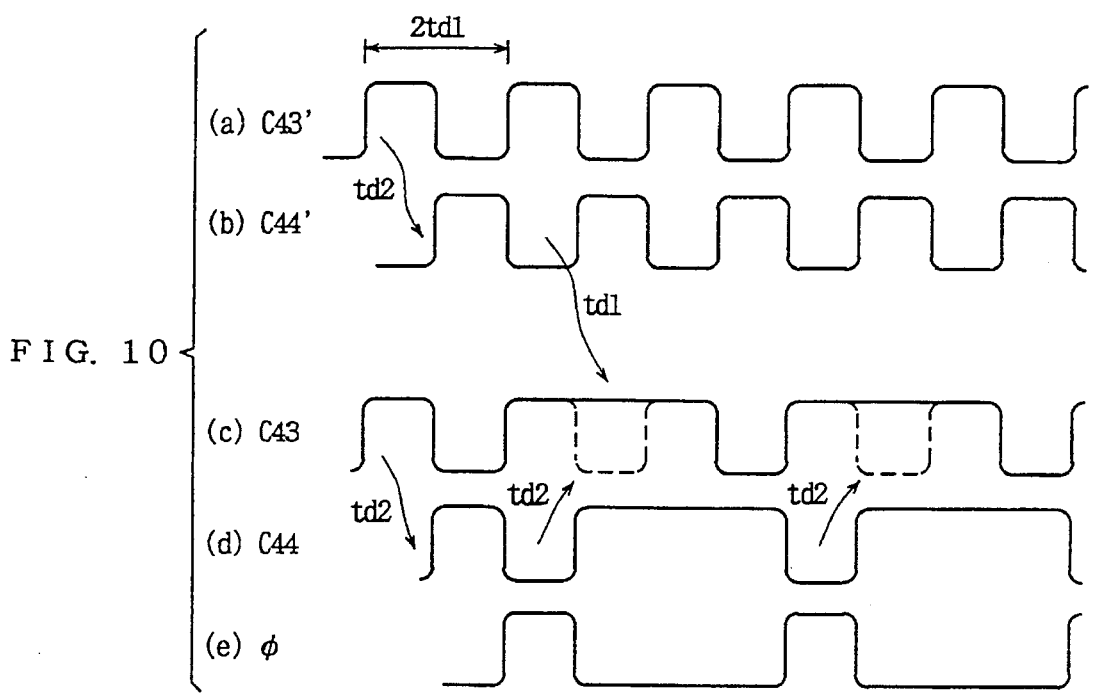
FIG. 10 is a timing chart for the operation of the VCO circuit shown in FIG. 9.

Operation of VCO circuit 40 shown in FIG. 9 will be described next. If the other input node 41a of NAND gate 41 is always at "H" level, VCO circuit 40 is operated as a ring oscillator formed of NAND gate 41 and first delay line 43. Then, as shown in FIG. 10(a), output signal C43' of first delay line 43 would be a rectangular wave signal with a duty ratio of 50%, a single cycle of which being time 2td1 which is twice as long as its delay time td1 (or, more correctly, time which is twice as long as the sum of delay time of NAND gate 41 and delay time td1 of first delay line 43). In addition, when the other input node 41a of NAND gate 41 turns to "L" level, node N43 turns to "H" level after a delay of about td1.

A situation will now be discussed in which signal C43' is delayed by delay time td2 of second delay line 44 to obtain a signal C44' which is input to the other input node 41a of NAND gate 41. As shown in FIG. 10(b), signal C44' would be a complementary signal of signal C43'. When signal C44' enters "L" level, node N43 would be at "H" level after a delay of about td1. Accordingly, signal C43 which appears on node N43 would be at "H" level at every other portions corresponding to the "L" level portions of signal C43', as shown in FIG. 10(c). Correspondingly, clock signal C44 appearing at the other input node 41a of the NAND gate would be delayed from signal C43 by td2 as shown in FIG. 10(d). Since output signal $\phi$ is an inverted signal of signal C44, it would be a rectangular wave signal with a duty ratio of about 25%, as shown in FIG. 10(e).

Figure 11:
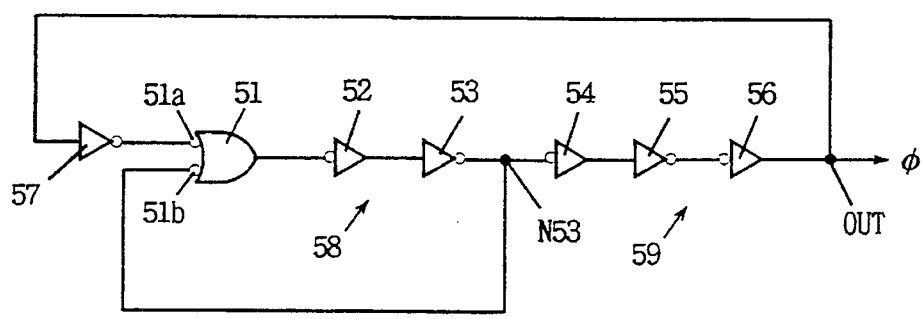
FIG. 11 is a circuit block diagram showing an implementation of the VCO circuit of FIG. 9.
Figure 12:
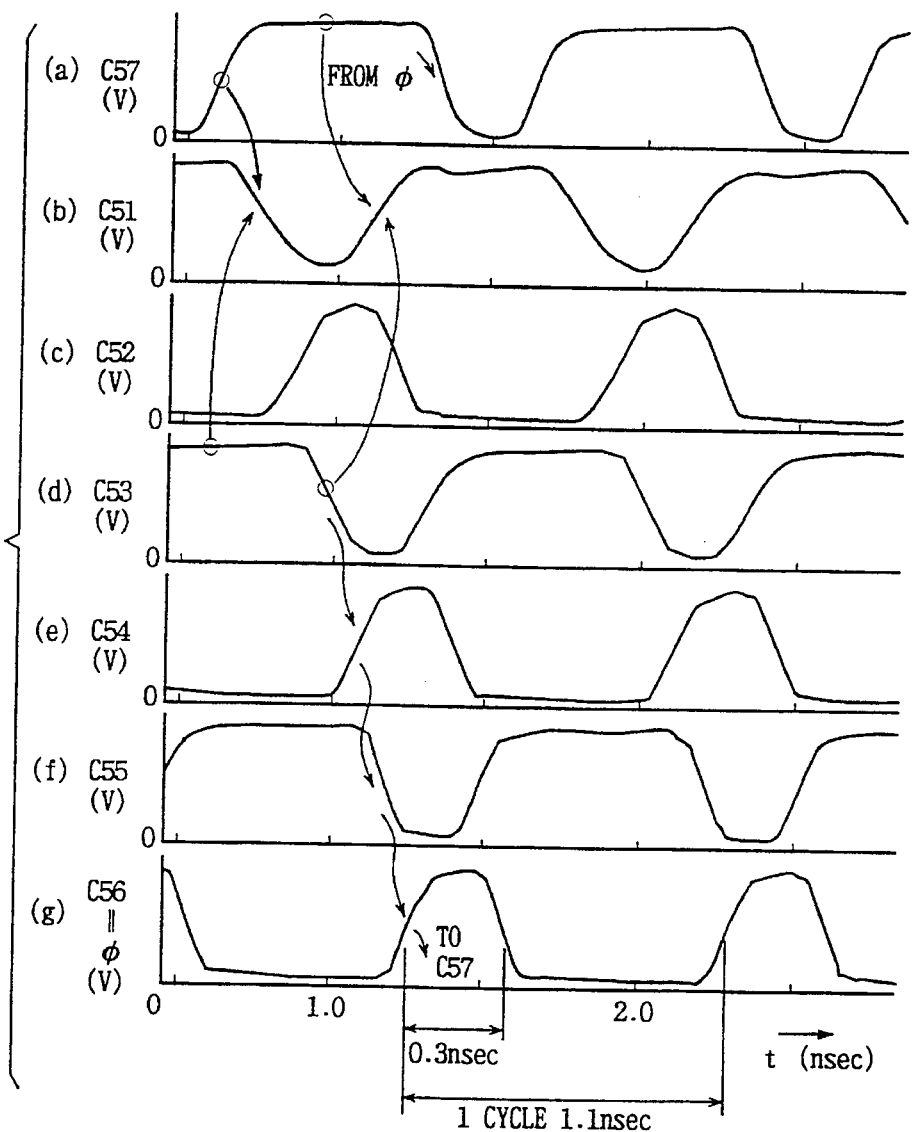
FIG. 12 is a timing chart for the operation of the VCO circuit of FIG. 11.

FIG. 11 is a block diagram showing a structure of a VCO circuit 50 which is an implementation of the VCO circuit 40 of FIG. 9. FIG. 12 is a timing chart for the operation of VCO circuit 50. Referring to FIG. 11, this VCO circuit 50 includes an NAND gate 51, and first and second delay lines 58, 59. First delay line 58 includes two serially connected delay time variable inverters 52 and 53, while second delay line 59 includes four serially connected delay time variable inverters 54 to 57.

First delay line 58 is connected between an output node of NAND gate 51 and an intermediate node 53 which is in turn connected to one input node 51b of NAND gate 51. Second delay line 59 is connected between intermediate node N53 and the other input node 51a of NAND gate 51. An output node OUT is connected to an output node of delay time variable inverter 56. Load driving capability of delay time variable inverters 54, 55, and 56 is increased gradually toward output node OUT.

As shown in FIG. 12, an output signal C51 of NAND gate 51 and output signals C52 to C57 of delay time variable inverters 52 to 57 are inverted successively. Each inversion takes place delayed by respective delay time of each element. When signal C53 is at "H" level, NAND gate 51 is operated as an inverter and signal C51 falls in response to the rise of output signal C57 of delay time variable inverter 57. When signal C57 is at "H" level, NAND gate 51 is operated as an inverter and signal C51 rises in response to the fall of output signal C53 of delay time variable inverter 53. In this example, an output signal φ (signal C56) which has a single cycle of 1.1 nsec and a pulse width of 0.3 nsec (that is, duty ratio of about 27%) was obtained.

Figure 13:
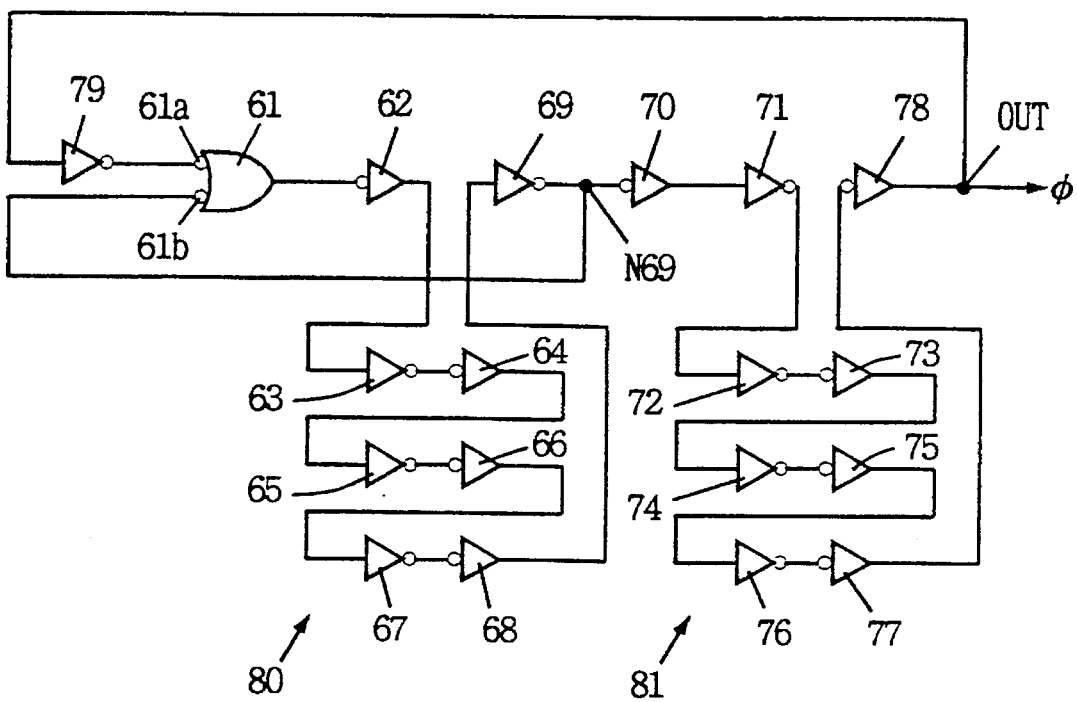
FIG. 13 is a circuit block diagram showing another implementation of the VCO circuit in FIG. 9.
Figure 14:
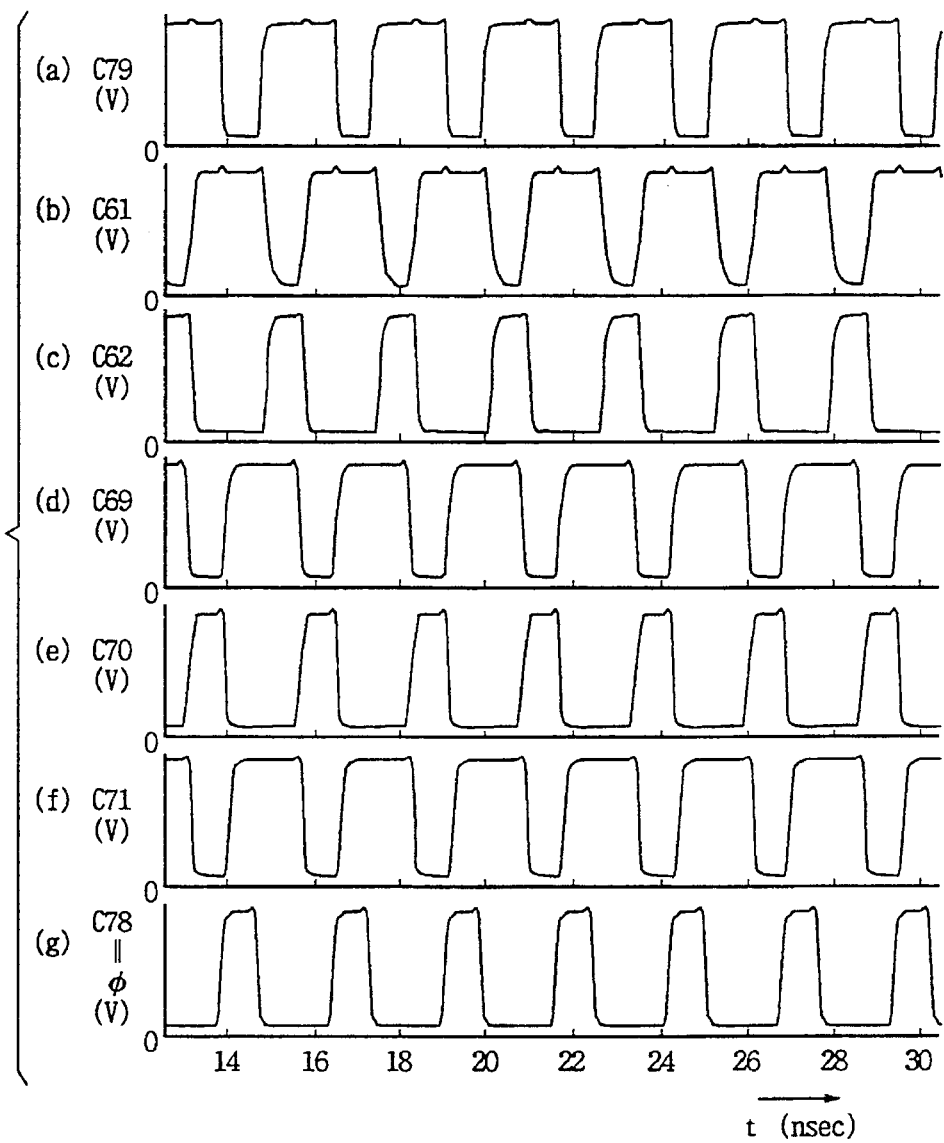
FIG. 14 is a timing chart for the operation of the VCO circuit of FIG. 13.

FIG. 13 is a circuit block diagram showing a structure of a VCO circuit 60 which is another implementation of VCO circuit 40 in FIG. 9. FIG. 14 is a timing chart for the operation of VCO circuit 60. Referring to FIG. 13, this VCO circuit 60 includes an NAND gate 61 and first and second delay lines 80 and 81. First delay line 80 includes eight serially connected delay time variable inverters 62 to 69, while second delay line 81 includes ten serially connected delay time variable inverters 70 to 79.

First delay line 80 is connected between an output node of NAND gate 61 and an intermediate node N69 which is in turn connected to one input node 61b of NAND gate 61. Second delay line 81 is connected between intermediate node N69 and the other input node 61a of NAND gate 61. An output node OUT is connected to an output node of delay time variable inverter 78. Load driving capabilities of delay time variable inverters 70 to 78 are increased gradually toward output node OUT.

As shown in FIG. 14, an output signal C61 of NAND gate 61 and output signals C62, C69, C70, C71, C78, and C79 of delay time variable inverters 62, 69, 70, 71, 78, and 79 are inverted successively, with a prescribed delay time for each inversion. In this example, an output signal φ (signal C78) which has a single cycle of 6.5 nsec and a pulse width of about 2 nsec (that is, duty ratio of about 31%) was obtained.

In VCO circuits 40, 50 and 60 according to the present embodiment, load driving capabilities of delay time variable inverters are increased gradually toward the output node so that provision of separate buffer 242 for load driving as in the conventional example is unnecessary. In addition, non-overlapped signals with a duty ratio of about 25% are obtained without conventional decoder 241. Therefore, if the PLL circuit is formed of VCO circuit 40, 50 or 60, the circuit would be made more compact, reduced in cost, and increased in its reliability.

Embodiment 4

FIG. 15 is a block diagram showing a structure of a PLL circuit 90 according to a fourth embodiment of the present invention. Referring to FIG. 15, this PLL circuit 90 includes a phase comparator 2, a charge pump+loop filter 3, and a VCO circuit 91.

Phase comparator 2 and charge pump+loop filter 3 are identical to those described in FIG. 1, and thus are not described in the following. VCO circuit 91 oscillates at a frequency f corresponding to a control voltage Vc so as to output two non-overlapped signals φ1 and φ2 each having a duty ratio of 25%. Signals φ1 and φ2 are supplied directly to a load capacitance CL. As signal φ1 is output to load capacitance CL, it is also fed back to phase comparator 2.

FIG. 16 is a circuit block diagram showing a structure of VCO circuit 91. For clarification, circuits relating to current control (that is, bias generating circuit 20, current sources 5.1b to 5.Mb, and 5.1c to 5.Mc shown in FIG. 2) are not shown in FIG. 16. This VCO circuit 91 includes an NAND gate 92, and first and second delay lines 101, 102. First and second delay lines 101 and 102 include four serially connected delay time variable inverters 93 to 96 and 97 to 100, respectively. First delay line 101 is connected between an output node of NAND gate 92 and an intermediate node N96 which is in turn connected to one input node 92b of NAND gate 92. Second delay line 102 is connected between intermediate node N96 and the input node 92a of NAND gate 92. A first output node OUT1 is connected to an output node of delay time variable inverter 93, while a second output node OUT2 is connected to an output node of delay time variable inverter 99.

Delay time variable inverters 94 to 96 have low load driving capability and delay time variable inverters 97 to 99 have their load driving capability increased successively toward second output node OUT2. Load driving capability of delay time variable inverter 100, NAND gate 92 and delay time variable inverter 93 is increased gradually toward first output node OUT1.

Since the operation of this VCO circuit 91 is similar to that of VCO circuit 40, further description is not given. FIG. 17 shows waveforms of signals φ1 and φ2 which are output from first and second output nodes OUT1 and OUT2, respectively. Signals φ1 and φ2 are the two non-overlapped signals often employed in a CMOS integrated circuit. Signals φ1 and φ2 correspond to signals C62 and C78 of FIG. 14, for example.

In PLL circuit 90 according to the present embodiment, two non-overlapped signals are produced without using any decoder or buffer as in the conventional example. Accordingly, the circuit is made more compact, made less expensive and is increased in its reliability.

Embodiment 5

Figure 18:
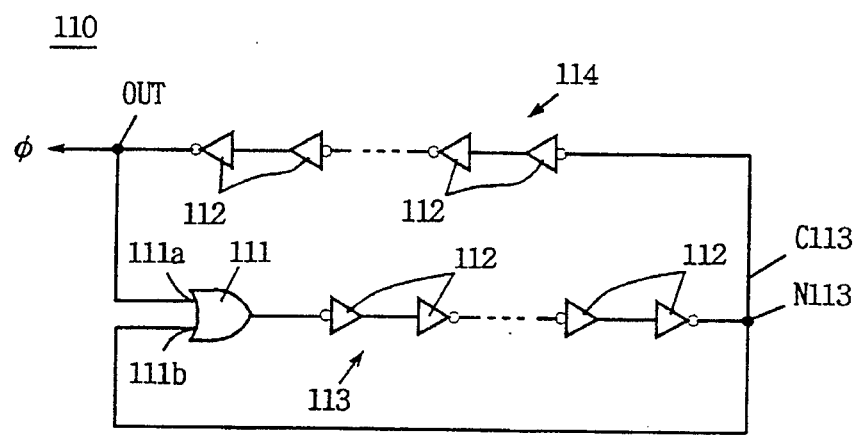
FIG. 18 is a partially omitted circuit block diagram showing a structure of a VCO circuit in accordance with a fifth embodiment of the present invention.

FIG. 18 is a circuit block diagram showing a structure of a VCO circuit 110 according to a fifth embodiment of the present invention. This VCO circuit 110 is provided with an NOR gate 111 in place of NAND gate 41 in VCO circuit 40 of FIG. 9, and can produce a clock signal φ having a duty ratio of about 25%.

Referring to FIG. 18, this VCO circuit 110 includes NOR gate 111, a first delay line 113 having a prescribed delay time td1, and a second delay line 114 having a prescribed delay time td2 (where td2≈td1). First and second delay lines 113 and 114 include an even number of serially connected delay time variable inverters 112, respectively.

First delay line 113 is connected between an output node of NOR gate 111 and an intermediate node N113, which is in turn connected to one input node 111b of NOR gate 111. Second delay line 114 is connected between intermediate node N113 and the other input node 111a of NOR gate 111. An output node OUT is connected to output node of second delay line 114 (that is, the other input node 111a of NOR gate 111). Load driving capability of delay time variable inverters 112 is increased successively toward output node OUT.

Operation of VCO circuit 110 shown in FIG. 18 will now be described. If the other input node 111a of NOR gate 111 is always at "L" level, VCO circuit 110 is operated as a ring oscillator formed of NOR gate 111 and first delay line 113. Then, an output signal C113' of first delay line 113 will be a rectangular wave signal with a duty ratio of 50%, a single cycle of which signal being twice as long as its delay time td1, that is, 2td1 (or more accurately, twice as long as the sum of the delay time of NOR gate 111 and delay time td1 of first delay line 113). In addition, when the other input node 111a of NOR gate 111 enters "H" level, node N113 will enter "L" level after a delay of about td1.

Figure 19:
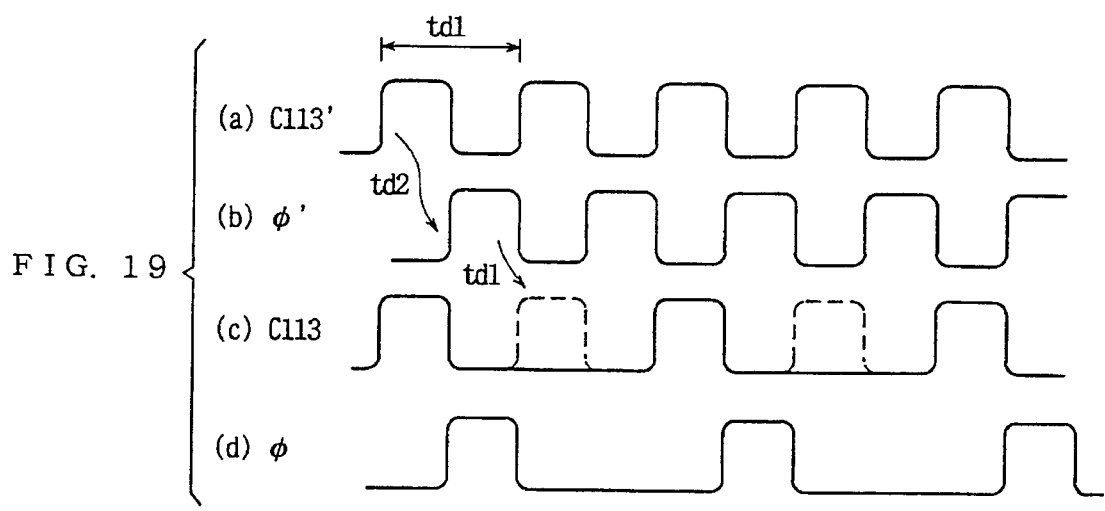
FIG. 19 is a timing chart for the operation of the VCO circuit in FIG. 18.

Discussion is now made of a situation in which a signal φ', which is delayed from signal c113' by td2 of second delay line 114, is input to the other input node 111a of NOR gate 111. As shown in FIG. 19(b), signal φ' would be a complementary signal of signal C113'. When signal φ' enters "H" level, node N113 will enter "L" level after a delay of td1, so that signal C113 which appears at node N113 will be at "L" level at portions corresponding to every other "H" level portions of signal C113', as shown in FIG. 10(c). Accordingly, signal C113 will be a rectangular wave signal with a duty ratio of 25%, and correspondingly, output signal φ also becomes a rectangular wave signal having a duty ratio of 25%, as shown in FIG. 10(d).

Figure 20:
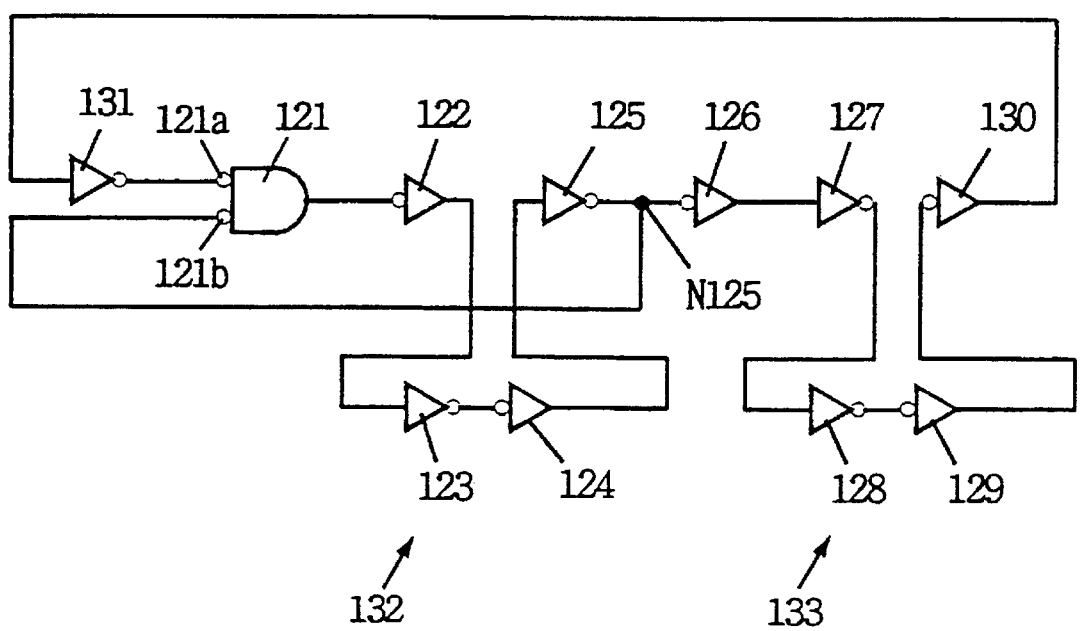
FIG. 20 is a circuit block diagram showing an implementation of the VCO circuit in FIG. 18.
Figure 21:
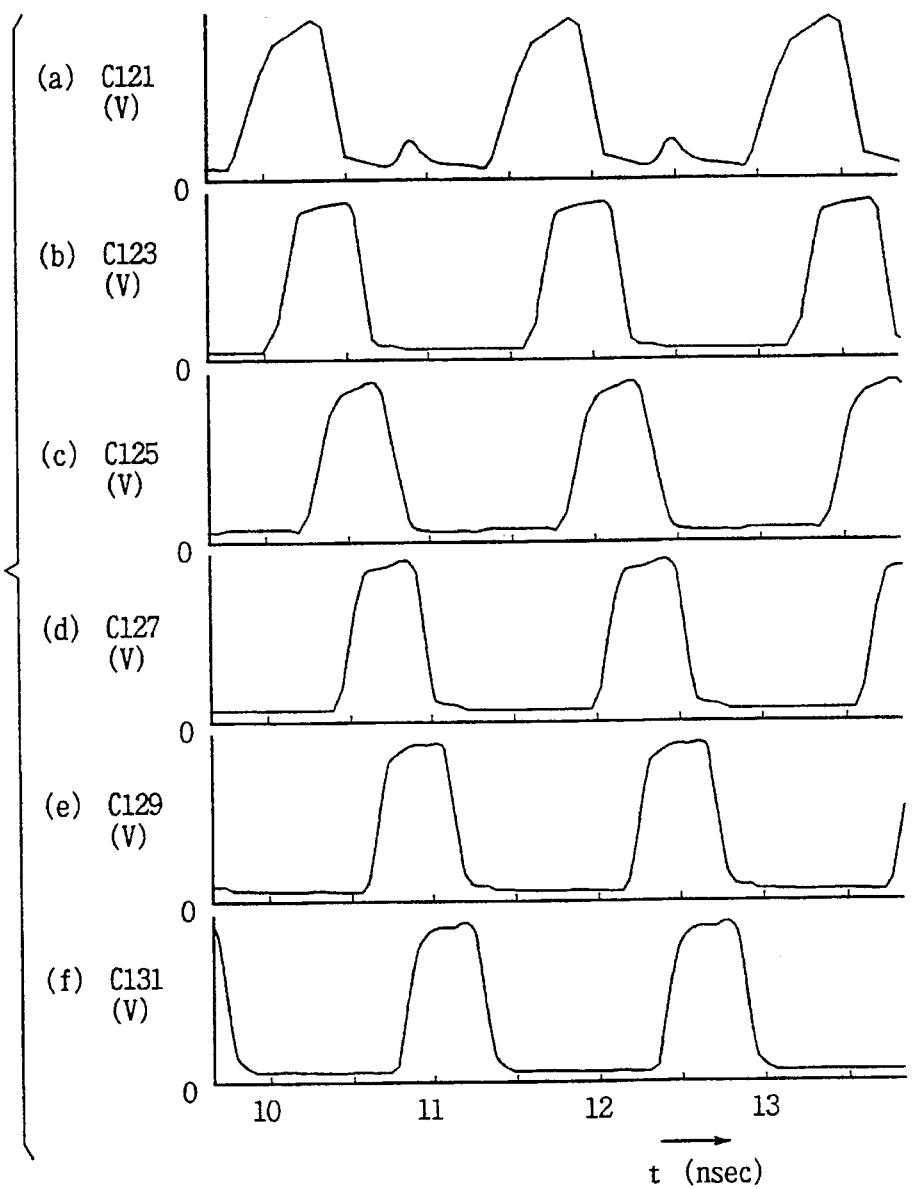
FIG. 21 is a timing chart for the operation of the VCO circuit in FIG. 20.
Figure 22:
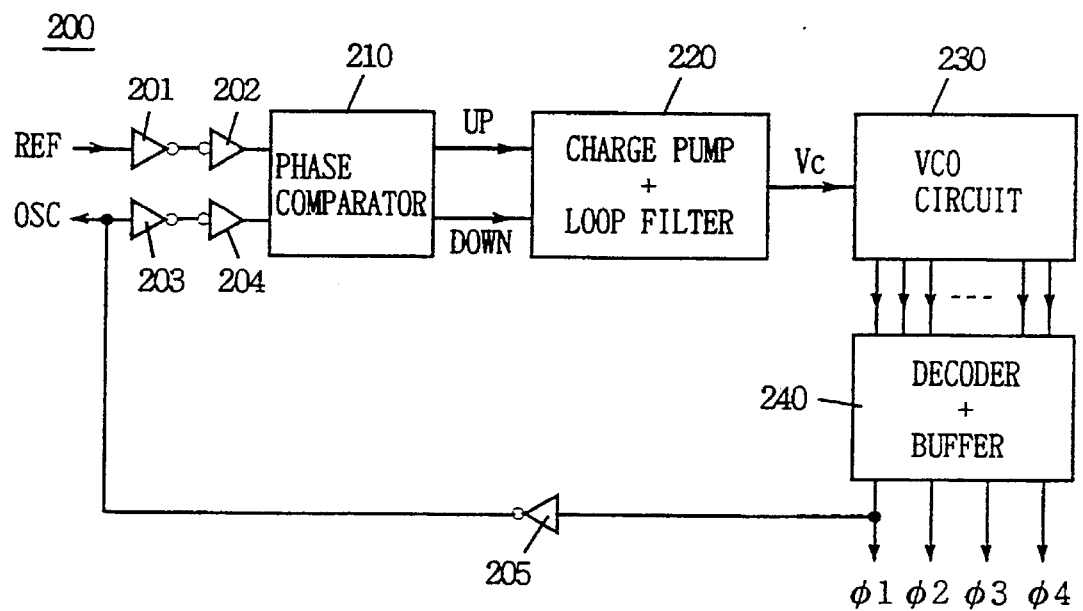
FIG. 22 is a circuit block diagram showing a structure of a conventional PLL circuit.

FIG. 20 is a circuit block diagram showing a structure of a VCO circuit 120 which is an implementation of VCO circuit 110 in FIG. 18. FIG. 21 is a timing chart for the operation of VCO circuit 120. Referring to FIG. 20, this VCO circuit 120 includes an NOR gate 121 and first and second delay lines 132, 133. First delay line 132 includes four delay time variable inverters 122 to 125 connected in series. Second delay line 133 includes six delay time variable inverters 126 to 131 connected in series.

First delay line 132 is connected between an output node of NOR gate 121 and an intermediate node N125 which is connected to one input node 121b of NOR gate 121. Second delay line 133 is connected between intermediate node N125 and the other input node N121a of NOR gate 121. An output signal C121 of NOR gate 121 and output signals C123, C125, C127, C129, and C131 of delay time variable inverters 123, 125, 127, 129, and 131 have their respective phases offset from one another by a prescribed delay time, and among these offset signals, signal C123 and signal C131, for example, are two non-overlapped signals.

Employment of VCO circuits 110 and 120 in the present embodiment would also lead to a formation of a PLL circuit in which buffer 242 and decoder 241 are eliminated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage controlled oscillator which oscillates at a frequency corresponding to a control voltage, comprising
a plurality of delay time variable elements connected in a ring shape, each having a delay time varied corresponding to said control voltage, with respective load driving capabilities increased gradually toward the output.

2. A voltage controlled oscillator which oscillates at a frequency corresponding to a control voltage, comprising:
a plurality of delay time variable elements connected in series, each having a delay time varied corresponding to said control voltage with respective load driving capabilities increased gradually toward the output; and
an oscillation control circuit receiving outputs from the delay time variable element at a terminating end and from any delay time variable element other than the one at the terminating end among said plurality of delay time variable elements, and inputting the output of said delay time variable elements other than the one at the terminating end to a delay time variable element at a starting end among said plurality of delay elements in synchronization with the output of said delay time variable element at the terminating end.

3. A phase locked loop circuit which produces an internal clock signal in synchronization with an externally provided reference clock signal, comprising:
a control voltage generating circuit receiving said reference clock signal and said internal clock signal and generating a control voltage corresponding to phase difference between the two clock signals; and
a plurality of delay time variable elements connected in a ring shaped manner, each having a delay time varied corresponding to said control voltage, with respective load driving capabilities increased gradually toward the output.

4. The phase locked loop circuit in accordance with claim 3, wherein
said control voltage generating circuit includes:
a phase comparator which receives said reference clock signal and said internal clock signal so as to output a control signal corresponding to the phase difference between the two clock signals;
a capacitor for outputting a control voltage corresponding to the phase difference between said two clock signals; and
a charge pump for charging or discharging said capacitor in response to the control signal output from said phase comparator.

5. The phase locked loop circuit in accordance with claim 4, wherein
said capacitor is formed on a semiconductor substrate with said plurality of delay time variable elements.

6. The phase locked loop circuit in accordance with claim 3, including
a divider circuit for dividing the frequency of said internal clock signal and outputting the divided internal clock signal to said control voltage generating circuit.

7. A phase locked loop circuit which produces an internal clock signal in synchronization with an externally provided reference clock signal, comprising:
a control voltage generating circuit receiving said reference clock signal and said internal clock signal and generating a control voltage corresponding to the phase difference between the two clock signals;
a plurality of delay time variable elements connected in series, each having a delay time varied corresponding to said control voltage, with respective load driving capabilities increased gradually toward the output; and an oscillation control circuit receiving outputs from the delay time variable element at a terminating end and any delay time variable element other than the one at the terminating end among said plurality of delay time variable elements, and inputting the output of said delay time variable element other than the one at the terminating end to a delay time variable element at a starting end among said plurality of delay time variable elements in synchronization with the output of said delay time variable element at the terminating end.

8. The phase locked loop circuit in accordance with claim 7, wherein said control voltage generating circuit includes:

a phase comparator receiving said reference clock signal and said internal clock signal and outputting a control signal corresponding to the phase difference between the two clock signals;

a capacitor for outputting a control voltage corresponding to the phase difference between said two clock signals; and a charge pump for charging or discharging said capacitor in response to the control signal output from said phase comparator.

9. The phase locked loop circuit in accordance with claim 8, wherein said capacitor is formed on a semiconductor substrate with said plurality of delay time variable elements.

10. The phase locked loop circuit in accordance with claim 7, including a divider circuit for dividing the frequency of said internal clock signal and outputting the divided internal clock signal to said control voltage generating circuit.

11. An oscillator which oscillates at a prescribed frequency to provide a plurality of non-overlapped signals with a duty ratio of about 25%, comprising:

a first delay circuit for receiving an input signal and providing a first output signal delayed from receipt of the input signal by a first delay time;

a second delay circuit for receiving the first output signal from the first delay circuit and providing a second output signal delayed from receipt of the first output signal by a second delay time; and a logic circuit receiving the first and second output signals of said first and second delay circuits to apply a logical result of said first and second output signals as said input signal to said first delay circuit.

12. An oscillator which oscillates at a prescribed frequency to provide a plurality of non-overlapped signals with a duty ratio of about 25%, comprising:

a first non-inverting delay circuit for outputting an input signal with a delay of a first delay time;

a second non-inverting delay circuit for outputting the output signal of said first non-inverting delay circuit with a delay of a second delay time; and an NAND gate receiving the output signals of said first and second non-inverting delay circuits to apply an inverted signal of the logical product signal of the two signals to said first non-inverting delay circuit.

* * * * *